Figure 1:
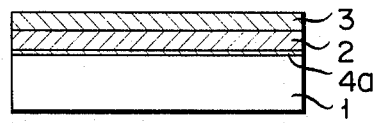

United States Patent [19]

Nakano et al.

[11] 4,350,729
[45] Sep. 21, 1982

[54] PATTERNED LAYER ARTICLE AND MANUFACTURING METHOD THEREFOR

[75] Inventors: Hirotaka Nakano; Kensaku Yano, both of Yokohama, Japan

[73] Assignee: Tokyo Shibaura Denki Kabushiki Kaisha, Kawasaki, Japan

[21] Appl. No.: 166,780

[22] Filed: Jul. 7, 1980

[30] Foreign Application Priority Data

Jul. 11, 1979 [JP] Japan .............................. 54-86882

[51] Int. Cl.³ .................. B32B 3/10; B32B 15/04; B44C 1/22; C23F 1/02
[52] U.S. Cl. ................................. 428/209; 156/643; 156/659.1; 156/667; 156/904; 204/192 E; 428/432; 428/469; 428/472; 428/697; 428/701; 428/702
[58] Field of Search ................... 156/643, 659.1, 667, 156/904; 204/192 E; 428/195, 209, 472, 701, 702, 432, 469, 697; 427/162, 164, 165

[56] References Cited

U.S. PATENT DOCUMENTS

4,106,975  8/1978  Berkenblit ........................... 156/667
4,134,777  1/1979  Borom ................................. 156/667

FOREIGN PATENT DOCUMENTS

49-46509 12/1974 Japan ................................. 156/657

*Primary Examiner*—Bruce H. Hess
*Attorney, Agent, or Firm*—Cushman, Darby & Cushman

[57] ABSTRACT

A patterned layer article for semiconductor devices or stripe filters of color television cameras characterized by using, as a base, a protective layer of an etching rate smaller than that of a thin layer for controlling the etching depth of the thin layer, and this protective layer, particularly consists of oxides of rare earth elements such as yttrium oxide, and scandium oxide.

14 Claims, 7 Drawing Figures

PATTERNED LAYER ARTICLE AND MANUFACTURING METHOD THEREFOR

The present invention relates to a patterned layer article, and more particularly, a patterned layer article which utilizes a protective layer as a base for controlling the etching depth of a thin layer, and a manufacturing method therefor.

In manufacturing patterned layer articles such as image pickup stripe filters used for single color image pickup tubes or cameras, dry etching is conventionally performed for forming a pattern on a thin layer of high melting point material such as $TiO_2$, $SiO_2$, $ZrO_2$, $Al_2O_3$, and $CeO_2$.

Dry etching is roughly classified according to the mechanism into chemical plasma etching, physical ion etching, and physical and chemical sputtering. The plasma etching utilizes the reaction of a gas and a solid material. The sputtering etching is further classified according to the kind of gas used into inert sputtering physical etching which uses an inert gas such as argon, and into reactive sputtering etching which uses an active gas e.g. a Freon-based gas and which combines physical sputtering and a chemical reaction. The ion etching separates plasma and ions and etches with the accelerated ions. The dry etching in the present invention includes all of these methods.

The dry etching method as described above is preferable in that it can eliminate adverse effects imposed on the thin layer by a residual etching liquid, which occurs in the case of a wet etching method. However, if dry etching is utilized in manufacturing inorganic color stripe filters with different spectral transmission characteristics, it is difficult to stop the etching with precision at the boundary between color stripe filters of different kinds. In order to overcome this problem, it has been disclosed by the Japanese patent Disclosure No. 115120/1977 to form a layer having a small etching rate for plasma etching at the boundary between the first color stripe filter and the second color stripe filter. This protective layer is made of aluminum oxide. However, in dry etching, for example in reactive sputtering etching in which the etching rate is relatively large, this aluminum oxide layer does not satisfactorily serve as a protective layer, resulting in various problems. The following are examples of these problems.

(a) The aluminum oxide layer does not satisfactorily serve as a protective layer for the first filter layer in the reactive sputtering etching at the point of reliable production. It is hard to stop the etching at the upper surface of the aluminum oxide layer with precision. Thus, the protective layer of aluminum oxide and, further, the first stripe filter will also be etched. Due to this, the spectral transmission characteristics of the first stripe filter deviate greatly from its expected transmission characteristics, and thus desired spectral characteristics are not obtained.

(b) Since the aluminum oxide layer does not sufficiently serve as a protective layer and the etching rate is not uniform even within a single dry etching apparatus differences in the depth of etching are generated depending on a location within a single dry etching apparatus. Thus, it is difficult to obtain first stripe filter of uniform spectral transmission characteristics throughout a number of substrates. This inhibits mass-production.

(c) Even with a single substrate, the etching rate of the multilayer is slower at the center than at the periphery of the substrate. Thus, there will be variations in etched depth. As a result, the aluminum oxide is etched deeper at the periphery, and regions of different spectral transmission characteristics are formed in the first filter layer.

(d) Variations in the etched depth are generated even at one region of the first stripe filter of a substrate. In the peripheral of one region of the first stripe filter, the etching rate is slower, and variations in the etched depth arise. As a result, the aluminum oxide at the center of the region is etched deeper and thus over-etched, while in the periphery un-etched material remains. Consequently, various different spectral transmission characteristics are formed even within a single region of the first stripe filter.

The use of a cerium compound as a protective layer is disclosed in the Japanese patent Disclosure No. 135348/1978. However, cerium fluorine, for example, is defective because of its large internal stress and weak adhesion with the substrate. Further, cerium oxide has a relatively large etching rate and high refractive index. Thus, in keeping the optical film thickness nd (where n is the refractive index and d is the physical film thickness) below a certain value, the physical film thickness becomes thinner and this will not satisfactorily serve as a protective layer. Cerium compounds thus present similar problems as (a)–(d) described above. Further, cerium compounds are defective in that they are not heat-resistant.

It is desirable to have a protective layer which can sufficiently withstand the reactive sputtering etching instead of aluminum oxide and cerium compounds for these reasons.

The present invention has been made to overcome these problems and has for its object to provide a protective layer which is improved in resistance to dry etching and thus to provide a dry etching method for manufacturing an etched pattern of high precision, and to provide a patterned layer article manufactured by this method.

To the above and other ends, the present invention provides a patterned layer article comprising: a substrate; a protective layer formed on the surface of the substrate and resistant to dry etching, said protective layer being selected from the group consisting of yttrium oxide, scandium oxide, neodymium oxide, promethium oxide, samarium oxide, europium oxide, gadolinium oxide, terbium oxide, dysprosium oxide, holmium oxide, erbium oxide, thulium oxide, ytterbium oxide and lutetium oxide; and at least one laminated and patterned layer formed on the surface of the protective layer.

The present invention further provides a method for manufacturing a patterned layer article which uses a protective layer of an etching rate smaller than that of a thin layer for controlling the etched depth of this thin layer at an etching step, characterized in that the protective layer is made of at least one compound selected from the group consisting of yttrium oxide, scandium oxide, neodymium oxide, promethium oxide, samarium oxide, europium oxide, gadolinium oxide, terbium oxide, dysprosium oxide, holmium oxide, erbium oxide, thulium oxide, ytterbium oxide and lutetium oxide.

Figure 4:
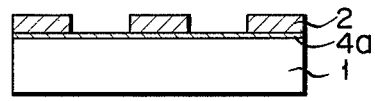
Figure 5:
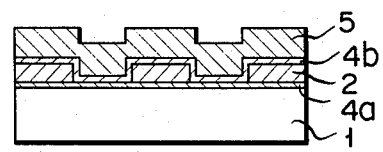
Figure 6:
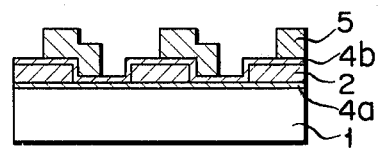
Figure 7:
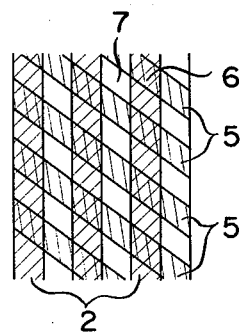

This invention can be more fully understood from the following detailed description when taken in conjunction with the accompanying drawings, in which:

FIGS. 1 to 6 show the preferred embodiment of the present invention in which a protective layer is included and a color stripe filter is formed by dry etching; and FIG. 7 is a plan view of FIG. 6.

The etching method of a multilayer will be described hereinafter. In this etching method, reactive sputtering etching is used as the dry etching; the etched material is a color stripe filter consisting of an inorganic multilayer, in particular, a color stripe filter used in single color image pickup tubes and solid state image pickup device; and e.g. yttrium oxide is used as a protective layer.

The color stripe filters are formed on a face plate of the image pickup tubes and are used for color television cameras. Various combinations of color stripe filters are possible, depending on the image pickup method employed. However, the following description will be made taking the frequency separating method as an example. As shown in FIG. 1, on a transparent substrate 1 is formed a yellow filter 2 comprising a multilayer of multi-layers of e.g. titanium oxide and silicon oxide. The first layer at the substrate side is formed as a protective layer 4a of, for example, yttrium oxide for the transparent substrate protection. The spectral transmission characteristics of the yellow filter 2 are insensitive to the film thickness of the protective layer of the first layer at the substrate side in many cases. Thus, the protective first layer at the substrate side may be a conventional aluminum oxide layer, or it may not even be formed. These layers may be formed by methods such as the electron beam deposition method and the sputtering method. The number and thickness of the layers of the yellow filter 2 are so designed that a desired yellow filter is obtained.

Figure 2:
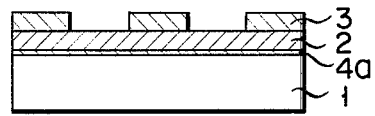
Figure 3:
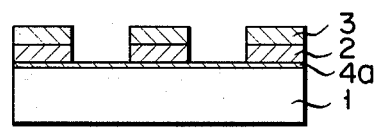

A photoresist 3, for example AZ-1350J (Trademark, a product of Shipley Far East Co. Ltd.), is painted thereon in a uniform thickness. Exposure and developing are performed. Thereafter, unnecessary portions of the photoresist are removed as shown in FIG. 2. The multilayer is set in an etching apparatus. The yellow filter 2 is etched, as shown in FIG. 3, by the reactive sputtering etching using the photoresist 3 as a mask. The reactive gas may be, for example, fluon 12 ($CCl_2F_2$). The etching is performed under the following conditions of $3 \times 10^{-3}$ Torr in gas pressure, 90 cc/min in gas flow rate, 200 W in power source, and about 30 minutes in etching time. The photoresist 3 is then removed by an organic solvent or by incineration of dry etching, and the yellow stripe filter 2 is formed as shown in FIG. 4. Then as shown in FIG. 5, a protective layer 4b of yttrium oxide is deposited over the entire surface for protection against dry etching. A cyan filter 5 which consists of multilayer of titanium oxide and silicon oxide is deposited thereover. A cyan stripe filter 5 is formed in a similar manner as in the formation of the yellow stripe filter 5. That is, after the photoresist is painted, it is exposed and developed. A patterned photoresist is thus formed to serve as a mask for the cyan filter 5. The portions on which the photoresist is not painted are etched away by reactive sputtering etching. In this instance, the protective layers 4b and 4a of yttrium oxide serve as protective layers of the yellow filter 2 and the transparent substrate 1. Thus, the etching is interrupted at the upper surface of the protective layer 4b of yttrium oxide. When the photoresist is removed, a patterned color stripe filter is formed as shown in FIG. 6. A green filter 6 is formed as a region where the yellow filter 2 and the cyan filter 5 overlap. A white filter 7 is a region where neither the yellow filter 2 nor the cyan filter 5 exist, and only the protective layers 4a and 4b exist.

Since yttrium oxide is used for the protective layer 4b of the yellow filter 2 in this embodiment, the variations in the spectral transmission characteristics of the yellow filter 2 due to the etching away of the protective layer do not occur as in the case when aluminum oxide is used instead, and mass-production is facilitated. Furthermore, there will be no variations in the spectral transmission characteristics within a single region of the yellow filter or a single substrate.

Although yttrium oxide is used in this embodiment for a protective layer against dry etching, it has been found that the other oxides mentioned earlier also serve better as a protective layer in comparison with aluminum oxide and cerium compounds. Their heat-resistance is also excellent. One example of the etching rate when etching is performed under the same conditions as described earlier is shown in the table below. The refractive index measured is also shown.

TABLE

| Kinds of oxide film | | Etching rate | Refractive index |
|---|---|---|---|
| Yttrium oxide | ($Y_2O_3$)8 | A/mm | 1.76 |
| Scandium oxide | ($Sc_2O_3$) | 9 | 1.90 |
| Cerium oxide | ($CeO_2$) | 60 | 2.3 |
| Aluminun oxide | ($Al_2O_8$) | 100 | 1.62 |
| Titanium oxide | ($TiO_2$) | 250 | 2.3 |
| Silicon oxide | ($SiO_2$) | 210 | 1.47 |

Among the oxides shown above, yttrium oxide and scandium oxide provide smaller etching rates and are thus most preferable for protective layers.

The following requirements are imposed for the protective layer of this color stripe filter:

(i) It should be possible to form a thin film by vacuum depositing, sputtering and so on.

(ii) It should be heat-resistant and nonreactive, and adhesion with the substrate must be strong. (iii) It should be transparent in visible light and refractive index should be sufficiently small.

In addition to yttrium and scandium oxide, the following oxides were found to satisfy these requirements: samarium oxide, europium oxide, gadolinium oxide, terbium oxide, dysprosium oxide, holmium oxide, erbium oxide, thulium oxide, ytterbium oxide, lutetium oxide, neodymium oxide and promethium oxide.

Although an oxide consisting of one oxide component has been described in this embodiment, it is to be understood that a layer of a mixture containing more than one of these oxide compounds may be used, or a layer of a mixture of one of these oxides such as yttrium oxide with another material such as aluminum oxide or zirconium oxide. In this case, the amount of aluminum oxide may be greater than the amount of the oxide used according to the present invention.

The embodiment has been described with reference to the color stripe filter to be used in the frequency separation method. However, it is to be understood that the present invention is also applicable for color stripe filters of different construction which are used for other methods such as the three-electrode method in which stripe filters of red, green and blue are used. The dry etching is not limited to reactive sputtering etching. The protective layer in accordance with the present invention can be effective, if combined with various other materials, in plasma etching, inert sputtering etching, ion etching and so on.

Further, although the dry etching method described is used for the manufacture of color stripe filters in the above embodiment, the present invention is also applicable to other methods which utilize dry etching, such as various processes for forming patterns in the manufacture of semiconductor devices. In this case, not only oxides that are transparent in visible light, but also colored oxides such as europium oxide ($Eu_2O_8$), can be used. Further, it is possible to use colored oxides for obtaining color stripe filters of different colors. Finally, although a multilayer consisting of titanium oxide and silicon oxide was used with the dry etching in the embodiment described above, it is to be understood that the present invention is applicable to dry etching of a single layer such as $SiO_2$.

What we claimed is:

1. A patterned layer article comprising:
   a substrate;
   a protective layer formed on the surface of the substrate and resistant to dry etching, said protective layer being selected from the group consisting of yttrium oxide, scandium oxide, neodymium oxide, promethium oxide, samarium oxide, europium oxide, gadolinium oxide, terbium oxide, dysprosium oxide, holmium oxide, erbium, oxide, thulium oxide, ytterbium oxide, and lutetium oxide; and
   at least one laminated and patterned layer formed on the surface of the protective layer, and having a larger etching rate than that of said protective layer.

2. An article as claimed in claim 1 wherein the protective layer consists of yttrium oxide, scandium oxide, or a mixture thereof.

3. An article as claimed in claim 1 or 2 wherein the substrate, protective layer, and, the laminated and patterned layer are light transmissive.

4. An article as claimed in claim 1 or 2 wherein the laminated and patterned layer consists of alternating layers of one inorganic material and another inorganic material.

5. An article as claimed in claim 4 wherein the laminated and patterned layer consists of alternating layers of at least one titanium oxide layer and at least one silicon oxide layer.

6. An article as claimed in claim 2 wherein the protective layer consists of a mixture of one material selected from the group consisting of yttrium oxide, scandium oxide or a mixture thereof; and at least one material selected from the group consisting of aluminum oxide, zirconium oxide and lanthanum oxide.

7. A method for manufacturing a patterned layer article, comprising the steps of:
   forming on the surface of a substrate a protective layer selected from the group consisting of yttrium oxide, scandium oxide, neodymium oxide, promethium oxide, samarium oxide, europium oxide, gadolinium oxide, terbium oxide, dysprosium oxide, holmium oxide, erbium oxide, thulium oxide, ytterbium oxide and lutetium oxide;
   forming on said protective layer alternating layers of one inorganic material on another inorganic material, said inorganic materials having a larger etching rate than that of said protective layer;
   forming a photoresist layer on said alternating layers;
   exposing and developing said photoresist layer to obtain a predetermined pattern thereof;
   etching said alternating layers in a predetermined pattern by means of dry etching; and
   removing said photoresist layer.

8. A method as claimed in claim 7 wherein the protective layer consists of yttrium oxide, scandium oxide or a mixture thereof.

9. A method as claimed in claim 7 or 8 wherein the thin layer consists of an alternating layer of more than one inorganic material.

10. A method as claimed in claim 9 wherein the thin layer consists of an alternating layer consisting of alternating layer of titanium oxide and silicon oxide.

11. A method as claimed in claim 8 wherein the protective layer consists of a mixture of one material selected from the group consisting of yttrium oxide, scandium oxide or a mixture thereof; and at least one material selected from the group consisting of aluminum oxide, zirconium oxide and lanthanum oxide.

12. A method as claimed in claim 7 wherein the etching step is carried out by means of plasma etching.

13. A method as claimed in claim 7 wherein the etching step is carried out by means of ion etching.

14. A method as claimed in claim 7, wherein the etching step is carried out by means of sputtering technique.

* * * * *